United States Patent
Mizoguchi

(10) Patent No.: US 10,063,212 B2
(45) Date of Patent: Aug. 28, 2018

(54) HIGH-FREQUENCY MODULE

(71) Applicant: Murata Manufacturing Co., Ltd., Nagaokakyo-shi, Kyoto-fu (JP)

(72) Inventor: Shinya Mizoguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/485,252

(22) Filed: Apr. 12, 2017

(65) Prior Publication Data

US 2017/0222617 A1    Aug. 3, 2017

Related U.S. Application Data

(63) Continuation of application No. PCT/JP2015/078996, filed on Oct. 14, 2015.

(30) Foreign Application Priority Data

Oct. 16, 2014   (JP) ................. 2014-211590

(51) Int. Cl.
*H03H 9/64*   (2006.01)
*H03H 9/00*   (2006.01)
(Continued)

(52) U.S. Cl.
CPC ............ *H03H 9/0009* (2013.01); *H03H 7/01* (2013.01); *H03H 9/25* (2013.01); *H03H 9/64* (2013.01)

(58) Field of Classification Search
CPC .......... H03H 7/01; H03H 7/46; H03H 9/0576; H03H 9/46; H03H 9/6483; H03H 9/725;
(Continued)

(56) References Cited

U.S. PATENT DOCUMENTS 7,978,019 B2 *   7/2011   Wiesbauer ............. H01P 1/213
                                                                  333/12
2009/0147707 A1   6/2009   Koga et al.
(Continued)

FOREIGN PATENT DOCUMENTS

JP    2011-010278 A    1/2011
JP    2012-109818 A    6/2012
(Continued)

OTHER PUBLICATIONS

Official Communication issued in International Patent Application PCT/JP2015/078996, dated Nov. 10, 2015.

*Primary Examiner* — Stephen E Jones
(74) *Attorney, Agent, or Firm* — Keating & Bennett, LLP

(57) ABSTRACT

A high-frequency module includes a propagation path that has a simple structure and improves filter characteristics by causing an inductor and a matching network to electromagnetic field couple with each other such that attenuation characteristics outside of a frequency band of a transmission signal are improved without increasing the size of the high-frequency module. In addition, unintended electromagnetic field coupling between a first filter and the inductor is significantly reduced or prevented by a shield electrode. Therefore, unintended propagation of a high-frequency signal is significantly reduced or prevented. Therefore, the attenuation characteristics outside of the frequency band of transmission signal input to the transmission terminal are improved more effectively.

20 Claims, 7 Drawing Sheets

(51) Int. Cl.
*H03H 9/25* (2006.01)
*H03H 7/01* (2006.01)

(58) Field of Classification Search
CPC .......... H03H 9/0009; H03H 9/25; H03H 9/64; H03H 9/0057; H03H 9/706; H03H 9/0571
USPC ......... 333/33, 133, 187, 188, 193, 194, 195, 333/196
See application file for complete search history.

(56) References Cited

U.S. PATENT DOCUMENTS

| | | |
|---|---|---|
| 2011/0193650 A1 | 8/2011 | Takenoshita et al. |
| 2012/0119847 A1 | 5/2012 | Iwaki et al. |
| 2015/0137909 A1 | 5/2015 | Okuda et al. |

FOREIGN PATENT DOCUMENTS

| | | |
|---|---|---|
| JP | 2014-180060 A | 9/2014 |
| WO | 2007/102560 A1 | 9/2007 |
| WO | 2011/089746 A1 | 7/2011 |

* cited by examiner

HIGH-FREQUENCY MODULE

CROSS REFERENCE TO RELATED APPLICATIONS

This application claims the benefit of priority to Japanese Patent Application No. 2014-211590 filed on Oct. 16, 2014 and is a Continuation Application of PCT Application No. PCT/JP2015/078996 filed on Oct. 14, 2015. The entire contents of each application are hereby incorporated herein by reference.

BACKGROUND OF THE INVENTION

1. Field of the Invention

The present invention relates to a high-frequency module that includes a module substrate on which a filter component is mounted.

2. Description of the Related Art

In the related art, high-frequency modules equipped with filters have been provided. For example, a filter 500 illustrated in FIG. 12 is mounted in a high-frequency module (for example, refer to Japanese Unexamined Patent Application Publication No. 2012-109818). The filter 500 includes a filter section 503, which is connected between a first terminal 501 and a second terminal 502, and a path 504 that is connected in parallel with the filter section 503. Therefore, a signal path, along which a high frequency (radio frequency (RF)) signal input to the first terminal 501 passes, splits into the path of the filter section 503 and the path 504, and consequently, when an RF signal is input to the first terminal 501, a first signal 505 passes through the filter section 503 and a second signal 506 passes along the path 504. Then, an RF signal which results from the first signal 505, which has passed through the filter section 503, and the second signal 506, which has passed along the path 504, being combined with each other is output from the second terminal 502.

The filter section 503 preferably includes a band pass filter in which a prescribed pass band is set. The filter section 503 allows an RF signal of the pass band to pass therethrough and attenuates RF signals that are outside the pass band. However, it may not be possible to attenuate RF signals outside the pass band to a desired value using just the filter section 503. Therefore, the path 504 is provided with a correction circuit formed of an inductor and a capacitor. The impedance of the path 504 is set such that the second signal 506 that passes along the path 504 and corresponds to a frequency band outside the pass band of the filter section 503 and the first signal 505 that passes through the filter section 503 and which it is desired to further attenuate opposite phases from each other in a frequency band outside the pass band of the filter section 503 and such that the amplitude of the first signal 505 and the amplitude of the second signal 506 are the same as each other in a frequency band outside the pass band of the filter section 503.

Therefore, the first signal 505 that passes through the filter section 503 and the second signal 506 that passes along the path 504 cancel each other out in a frequency band outside the pass band of the filter section 503 at a connection point between a signal line on the output side of the filter section 503 and a signal line on the output side of the path 504, and therefore an RF signal of a frequency band outside the pass band output from the second terminal 502 is attenuated. Therefore, the attenuation characteristics of the filter 500 for an RF signal outside the pass band of the filter 500 are improved. In addition, in the case where another filter, which preferably includes a band pass filter in which a pass band is set that is different from that of the filter 500, is arranged adjacent to the filter 500, the occurrence of a situation in which an RF signal outside the pass band of the filter 500 is output from the second terminal 502 and flows around to the other filter is suppressed. Therefore, it is possible to improve the isolation characteristics between the filter 500 and the other filter that are arranged adjacent to each other.

In the filter 500 of the related art described above, in order to improve the attenuation characteristics for an RF signal outside the prescribed pass band, the path 504 has to be provided separately from the filter section 503, the path 504 being provided with a correction circuit (circuit elements such as an inductor, a capacitor and so on) for generating an RF signal having the opposite phase to an RF signal outside the pass band that passes through the filter section 503. Therefore, there is a problem in that the filter 500 is increased in size and a high-frequency module that includes the filter 500 is increased in size.

SUMMARY OF THE INVENTION

Preferred embodiments of the present invention provide a technology that improves attenuation characteristics outside a frequency band of a first high-frequency signal input to a first terminal without increasing a size of a high-frequency module.

A high-frequency module according to a preferred embodiment of the present invention includes a filter component including a first terminal to which a first high-frequency signal is input, a first filter through which the first high-frequency signal input to the first terminal passes, a second terminal that outputs the first high-frequency signal that has passed through the first filter, and a third terminal that is connected to the first filter; a matching network that is connected to the second terminal; a module substrate on which the filter component is mounted; an inductor that adjusts characteristics of the first filter and is provided inside the module substrate and that has one end thereof connected to the third terminal and has another end thereof connected to ground; and a shield electrode that is provided between the inductor and the filter component; wherein the inductor and the matching network define a propagation path by electromagnetic field coupling with each other, the matching network and the filter component do not electromagnetic field couple with each other, and the shield electrode is located to suppress electromagnetic field coupling between the inductor and the filter component.

It is preferable that the matching network and the first filter do not electromagnetic field couple with each other and that the shield electrode is located to suppress electromagnetic field coupling between the inductor and the first filter.

In a preferred embodiment of the present invention, the first high-frequency signal input to the first terminal passes through the first filter and along the propagation path, and then the two signals combine with each other in an output-side signal path of the first filter, to which the propagation path is connected.

The degree of electromagnetic field coupling that defines the propagation path that branches from the first filter is adjusted such that the phase characteristics of first high-frequency signal that passes along the propagation path outside the frequency band of the first high-frequency signal are different from the phase characteristics of the first high-frequency signal that passes through the first filter outside the frequency band of the first high-frequency signal. Therefore, the outside-of-frequency-band portion of the first high-frequency signal that passes through the first filter and the outside-of-frequency-band portion of the first high-frequency signal that passes along the propagation path cancel each other out and are attenuated upon combining with each other. Therefore, compared with the configuration of the related art in which a correction circuit is formed by adding a circuit element such as an inductor or a capacitor, the propagation path that improves the filter characteristics is able to have a simple configuration, and therefore, the attenuation characteristics outside the frequency band of the first high-frequency signal input to the first terminal are able to be improved without increasing the size of the high-frequency module.

In addition, the shield electrode is provided between the inductor and the filter component so as to suppress electromagnetic field coupling between the inductor and the first filter. Consequently, unintended electromagnetic field coupling between the first filter and the inductor is significantly reduced or prevented. Therefore, unintended propagation of a high-frequency signal is significantly reduced or prevented. Therefore, attenuation characteristics outside the frequency band of the first high-frequency signal input to the first terminal are more effectively improved.

In addition, a distance between the matching network and the first filter is preferably larger than a distance between the matching network and the inductor.

With this configuration, unintended electromagnetic field coupling between the first filter and the inductor, which is electromagnetic field coupled with the matching network, is significantly reduced or prevented. Therefore, unintended propagation of a high-frequency signal is significantly reduced or prevented. Therefore, attenuation characteristics outside the frequency band of the first high-frequency signal input to the first terminal are able to be more effectively improved.

In addition, the matching network preferably includes a chip-type circuit component that is mounted on a mounting electrode provided on a mounting surface of the module substrate, and the circuit component and the shield electrode are preferably located so as not to be superposed with each other in plan view.

With this configuration, since the shield electrode is not located directly below the circuit component, which defines the matching network, in the thickness direction of the module substrate, the matching network and the inductor are able to electromagnetic field couple with each other with certainty. As a result, attenuation characteristics outside the frequency band of the first high-frequency signal input to the first terminal are able to be more effectively improved.

It is preferable that the module substrate includes a plurality of dielectric layers, the matching network is provided inside the module substrate, and that the shield electrode is provided between the matching network and the first filter.

With this configuration, unintended electromagnetic field coupling between the matching network and the first filter is significantly reduced or prevented. Therefore, unintended propagation of a high-frequency signal is significantly reduced or prevented. Therefore, attenuation characteristics outside the frequency band of the first high-frequency signal input to the first terminal are more effectively improved. In addition, degradation of the characteristics of the first filter caused by such unintended electromagnetic field coupling is significantly reduced or prevented.

The matching network is preferably provided on the same dielectric layer as the inductor among the plurality of dielectric layers.

With this configuration, the matching network and the inductor, which are arranged adjacent to each other, are able to to electromagnetic field couple with each other with certainty.

Furthermore, the matching network is provided on a different dielectric layer from the inductor among the plurality of dielectric layers, and the matching network and the inductor are partially superposed with each other in plan view.

With this configuration, the matching network and the inductor, which are partially superposed with each other in plan view, are able to electromagnetic field couple with each other with certainty.

In addition, the matching network preferably includes wiring electrodes provided across the plurality of dielectric layers, and the inductor preferably includes wiring electrodes provided across the plurality of dielectric layers.

With this configuration, a capacitor of the matching network or an inductor of the matching network is able to be formed with high precision and the inductor that adjusts the characteristics of the first filter is able to be formed with high precision.

In addition, the inductor is preferably not superposed with the first filter in plan view.

With this configuration, since unintended electromagnetic field coupling between the first filter and the inductor is significantly reduced or prevented and unintended propagation of a high-frequency signal is significantly reduced or prevented, the attenuation characteristics outside the frequency band of the first high-frequency signal input to the first terminal are more effectively improved. In addition, the matching network and the inductor are able to electromagnetic field couple with each other with certainty inside the module substrate and the attenuation characteristics outside the frequency band of the first high-frequency signal input to the first terminal is able to be more effectively improved.

Furthermore, it is preferable that the filter component further include a second filter that preferably includes a plurality of resonators and through which a second high-frequency signal of a prescribed frequency band input to the second terminal passes, and a fourth terminal that outputs the second high-frequency signal that has passed through the second filter, wherein a pass band of the first filter is set as a frequency band of a transmission signal, which is the first high-frequency signal, and a pass band of the second filter is set as a frequency band of a reception signal, which is the second high-frequency signal.

With this configuration, since a situation in which a high-frequency signal that is outside the frequency band of a transmission signal, which is the first high-frequency signal, and has substantially the same frequency band as a reception signal, which is the second high-frequency signal, flows around to the second filter side from the output-side signal path of the first filter and is output from the fourth terminal is suppressed, a high-frequency module is able to be provided that includes a first filter and a second filter having improved isolation characteristics.

According to various preferred embodiments of the present invention, a propagation path that improves filter characteristics is provided with a simple configuration by causing the inductor and the matching network to electromagnetic field couple with each other, and therefore the attenuation characteristics outside the frequency band of the first high-frequency signal are improved without increasing the size of the high-frequency module. In addition, unintended electromagnetic field coupling between the first filter and each inductor is significantly reduced or prevented by the shield electrode and therefore, unintended propagation of a high-frequency signal is significantly reduced or prevented. Therefore, attenuation characteristics outside the frequency band of the first high-frequency signal input to the first terminal are more effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
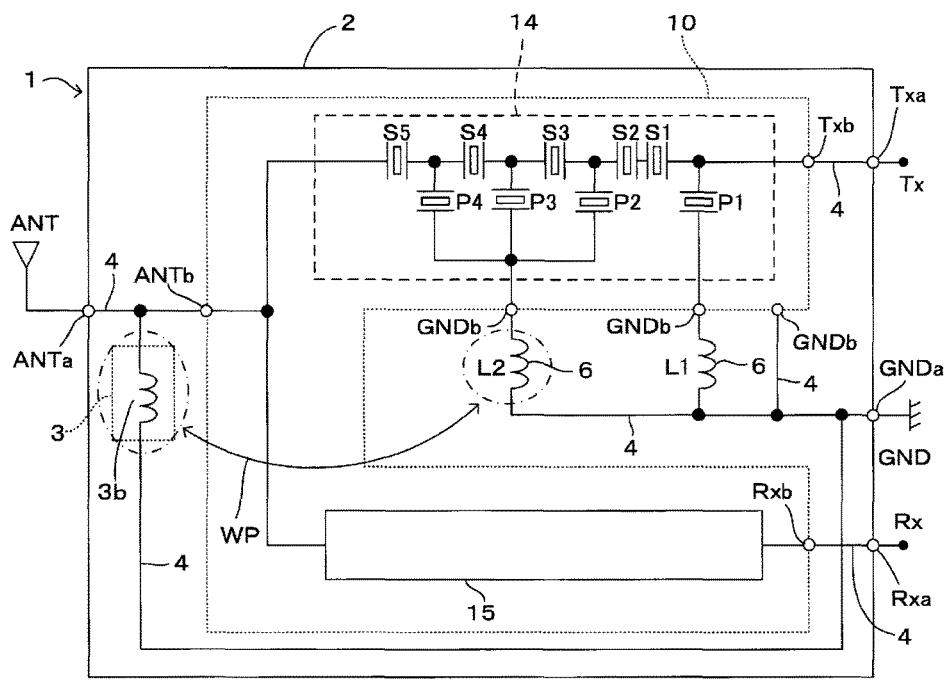
FIG. 1 is a circuit block diagram of a high-frequency module according to a first preferred embodiment of the present invention.
Figure 2:
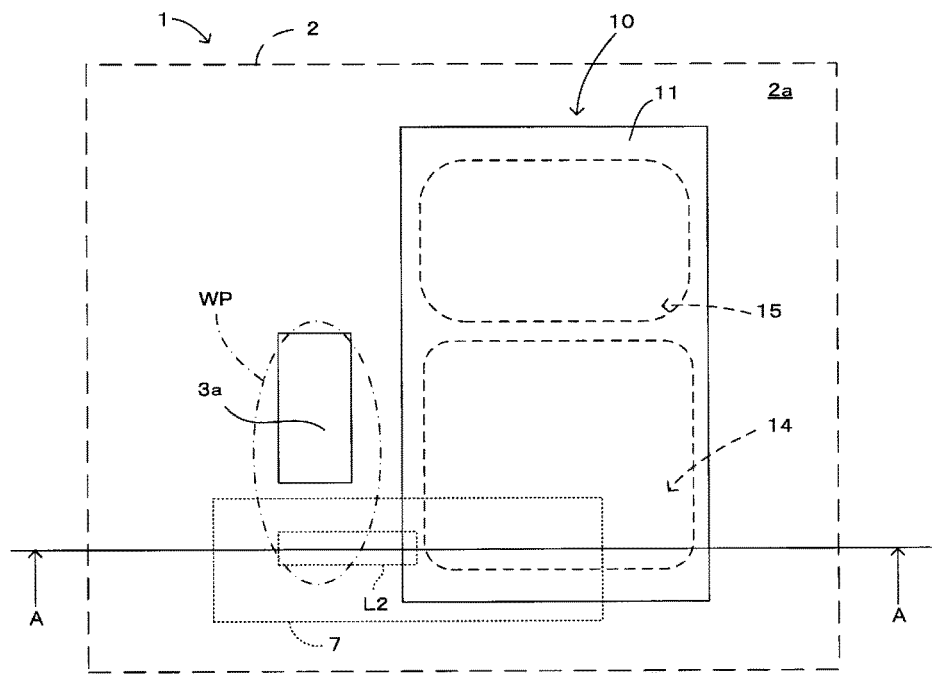
FIG. 2 is a see-through view seen from a mounting surface side of the high-frequency module according to the first preferred embodiment of the present invention.
Figure 3:
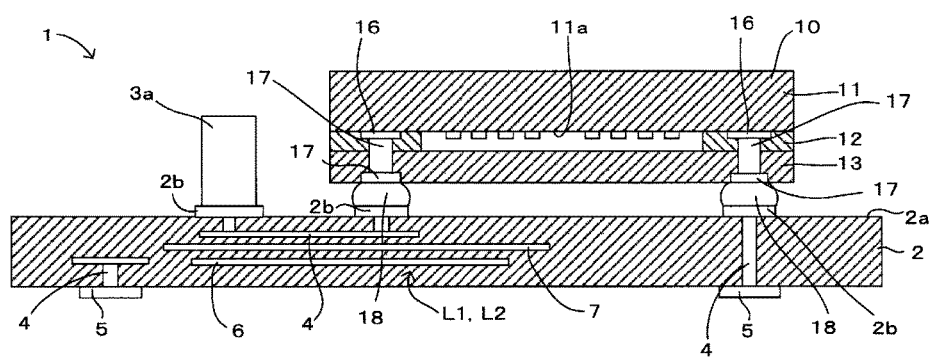
FIG. 3 is a sectional view of the high-frequency module illustrated in FIG. 2 looking in the direction of arrows and taken along line A-A.

A first preferred embodiment of a high-frequency module of the present invention will be described while referring to FIGS. 1 to 5. In FIGS. 1 to 3, only important portions of the configuration related to the present invention are illustrated and illustration of other portions of the configuration is omitted in order to simplify the description. Furthermore, in each of the figures referred to in subsequent descriptions, only the important portions of the configuration are illustrated, as in FIGS. 1 to 3 and description thereof is omitted in the subsequent descriptions.

A high-frequency module 1 illustrated in FIGS. 1 to 3 is to be mounted on a mother substrate of a mobile communication terminal such as a cellular phone or a mobile information terminal, for example. In this preferred embodiment, the high-frequency module 1 includes a filter component 10 (duplexer), which is provided with a first filter 14 and a second filter 15, a module substrate 2, a matching network 3, and various electronic components (not illustrated) such as switch ICs, other filter components, resistors, capacitors and inductors, and is a high-frequency antenna switching module, for example.

In addition, the filter component 10, a chip circuit component 3a defining the matching network 3 and at least some of the various other electronic components are mounted on a plurality of mounting electrodes 2b provided on a mounting surface 2a of the module substrate 2. The various components 10 and 3a, the electronic components and so on and a plurality of mounting electrodes 5, which are provided on a rear surface of the module substrate 2, are electrically connected to each other via wiring electrodes 4 provided in the module substrate 2, and the various components 10 and 3a and the various electronic components are electrically connected to each other via the wiring electrodes 4. In addition, a transmission electrode Txa to which a transmission signal, which is a first high-frequency signal, is input from the outside, a common electrode ANTa from which a transmission signal input to the transmission electrode Txa is output to the outside and to which a reception signal, which is a second high-frequency signal, is input from the outside, a reception electrode Rxa from which a reception signal input to the common electrode ANTa is output to the outside, and a ground electrode GNDa, which is connected to a ground path, are defined by the mounting electrodes 5.

Furthermore, wiring electrodes that correspond to various signal paths such as a common path, the ground path, a transmission path and a reception path are provided in or on the mother substrate of the mobile communication terminal. The high-frequency module 1 is mounted on the mother substrate, and as a result the wiring electrodes that define the various paths, and the common electrode ANTa, the ground electrode GNDa, the transmission electrode Txa and the reception electrode Rxa are connected to each other and transmission and reception signals are input and output between the mother substrate and the high-frequency module 1.

In this preferred embodiment, the module substrate 2 preferably includes a multilayer substrate that includes a plurality of dielectric layers. The wiring electrodes 4, the mounting electrodes 5, wiring electrodes 6, which define inductors L1 and L2, a flat-plate-shaped shield electrode 7 that is connected to the ground electrode GNDa and so forth are provided in the module substrate 2 preferably by forming via conductors and in-plane conductor patterns in and on the dielectric layers. The inductors L1 and L2 adjust the characteristics of the first filter 14. In addition, circuit elements such as other inductors, capacitors and the like may be additionally defined by in-plane conductor patterns and via conductors provided on and in the dielectric layers of the module substrate 2. Furthermore, various circuits such as another filter circuit and the matching network may be provided by combining such circuit elements. The connection states between the inductors L1 and L2 and the first filter 14 will be described in detail later.

The module substrate 2 may be a multilayer substrate such as a printed substrate, an LTCC, an alumina-based substrate or a composite material substrate using, for example, a resin, a ceramic or a polymer material, and the module substrate 2 may be formed by selecting the most suitable material in accordance with the intended use of the high-frequency module 1.

In this preferred embodiment, the matching network 3 preferably includes an inductor 3b, which is provided inside the chip-type circuit component 3a mounted on the mounting surface 2a of the module substrate 2. Specifically, as illustrated in FIG. 1, one end of the inductor 3b is connected to a path that connects a common terminal ANTb (corresponding to a "second terminal") of the filter component 10 and the common electrode ANTa of the module substrate 2. The other end of the inductor 3b is connected to the ground electrode GNDa, which is connected to ground, via a ground connection wiring electrode 4 provided in the module substrate 2, and thus the matching network 3 is provided.

The matching network 3 is not limited to the configuration illustrated in FIG. 1, and the matching network 3 may be provided by replacing the inductor 3b illustrated in FIG. 1 with a capacitor. Alternatively, a matching network 3 may be provided by connecting an inductor or a capacitor in series with the path that connects the common electrode ANTa and the common terminal ANTb to each other and that is built into the module substrate 2. In addition, the matching network 3 may be provided by using an inductor and a capacitor in combination with each other. In other words, the matching network 3 may include any circuit configuration that would be typically used to match the impedances of a circuit element such as an antenna connected to the common electrode ANTa and the filter component 10 connected to the common terminal ANTb in the high-frequency module 1. In addition, a matching network 3 may be additionally provided on the side of a transmission terminal Txb and a reception terminal Rxb.

The filter component 10 preferably has a wafer level package (WLP) structure and includes a filter substrate 11 that has a rectangular or rectangular shape in plan view, an insulating layer 12, a cover layer 13, and the first filter 14 and the second filter 15, which have different high-frequency signal pass bands from each other.

A transmission SAW filter element, which is included in the first filter 14, and a reception SAW filter element, which is included in the second filter 15, are located in a prescribed region of one main surface 11a of the filter substrate 11 (refer to FIG. 1).

In addition, as illustrated in FIG. 3, terminal electrodes 16, which are connected to comb-tooth electrodes and reflectors, are provided on the one main surface 11a of the filter substrate 11. Electrodes 17, which penetrate through the insulating layer 12, are connected to the terminal electrodes 16, and the transmission terminal Txb (corresponding to a "first terminal"), the common terminal ANTb, the reception terminal Rxb (fourth terminal) and a plurality of ground terminals GNDb (corresponding to a "third terminal") are defined by the electrodes 17, which are exposed from a main surface of the cover layer 13.

A transmission signal of a prescribed frequency band is input to the transmission terminal Txb from the transmission electrode Txa and the input transmission signal passes through the first filter 14 and is output to the common electrode ANTa from the common terminal ANTb. In addition, a reception signal of a prescribed frequency band is input to the common terminal ANTb from the common electrode ANTa, and the input reception signal passes through the second filter 15 and is output to the reception electrode Rxa from the reception terminal Rxb.

The insulating layer 12 surrounds a prescribed region of the one main surface 11a of the filter substrate 11 in which comb-tooth electrodes and reflectors are provided.

The cover layer 13 is provided on the insulating layer 12 and defines, together with the insulating layer 12, an enclosed space between the cover layer 13 and the filter substrate 11, and the transmission SAW filter element and the reception SAW filter element are provided inside the space. Then, mounting solder balls 18 are provided on the electrodes 17, which are connected to the terminal electrodes 16 and are exposed from the main surface of the cover layer 13 on the side opposite the space in which the filter elements are located, and formation of the filter component 10 is thus completed.

The filter component 10 is connected to the mounting electrodes 2b of the mounting surface 2a of the module substrate 2 via the solder balls 18 provided on the electrodes 17 such that the cover layer 13 faces the mounting surface 2a of the module substrate 2.

Next, the configurations of the first filter 14 and the second filter 15 will be described. The frequency band of a transmission signal is set as the pass band of the first filter 14 and the frequency band of a reception signal, which is different to the frequency band of the transmission signal, is set as the pass band of the second filter 15.

As illustrated in FIG. 1, the transmission SAW filter element of the first filter 14 is located in a prescribed region of the one main surface of the filter substrate 11 by connecting a plurality of SAW resonators, which include comb-tooth electrodes and reflectors, to each other in a ladder configuration. Specifically, the first filter 14 includes a plurality of (for example, five in this preferred embodiment) series arm resonators S1, S2, S3, S4 and S5, which are arranged in a series arm that connects the transmission terminal Txb and the common terminal ANTb to each other, and a plurality of (for example, four in this preferred embodiment) parallel arm resonators P1, P2, P3 and P4 that are connected between the series arm and ground-wiring-line ground terminals GNDb.

In addition, one end of the parallel arm resonator P1 is connected to a point between the transmission terminal Txb and the series arm resonator S1 and the other end of the parallel arm resonator P1 is connected to the corresponding ground terminal GNDb. One end of the inductor L1 is connected to the other end of the parallel arm resonator P1 via the ground terminal GNDb and the other end of the inductor L1 is connected to the ground electrode GNDa, and in this way, the parallel arm resonator P1 is electrically connected to the ground electrode GNDa (ground) via the inductor L1.

In addition, one end of the parallel arm resonator P2 is connected to a point between the series arm resonators S2 and S3, one end of the parallel arm resonator P3 is connected to a point between the series arm resonators S3 and S4, one end of the parallel arm resonator P4 is connected to a point between the series arm resonators S4 and S5, and the other ends of the parallel arm resonators P2, P3 and P4 are connected to the corresponding ground terminal GNDb. One end of the inductor L2 is connected to the other ends of the parallel arm resonators P2, P3 and P4 via the ground terminal GNDb and the other end of the inductor L2 is connected to the ground electrode GNDa, and in this way, the parallel arm resonators P2, P3 and P4 are electrically connected to the ground electrode GNDa (ground) via the inductor L2.

In addition, the attenuation characteristics of the first filter 14 is able to be adjusted by appropriately adjusting the inductances of the inductors L1 and L2. Specifically, an attenuation pole is able to be located at the position of an arbitrary frequency on the low-frequency side or the high-frequency side of the pass band of the first filter 14 by adjusting the inductances of the inductors L1 and L2. The resonators P1 to P4 are electrically connected to the ground terminal GNDb via internal wiring electrodes, which are not illustrated, inside the filter component 10, and are thus connected to the ground electrode GNDa (ground).

The reception SAW filter element of the second filter 15 outputs a reception signal of a prescribed frequency band, which is input to the common terminal ANTb, to the reception terminal Rxb. In addition, the second filter 15 is located in a prescribed region of the one main surface 11a of the filter substrate 11 by connecting a plurality of resonators, which each include comb-tooth electrodes and reflectors, to each other. The configuration of the second filter 15 is the same as that of the first filter 14 and therefore detailed description thereof is omitted.

The second filter 15 may be a balanced filter in which two reception terminals Rxb are provided and a reception signal is output in a balanced manner.

In this preferred embodiment, the inductors L1 and L2, which adjust the characteristics of the first filter 14 of the filter component 10, are defined by the wiring electrodes 6 located inside the module substrate 2. In addition, as illustrated in FIGS. 1 and 2, the wiring electrodes 6 that define the inductor L2 are located close to the circuit component 3a in plan view. Furthermore, the shield electrode 7 is located between the inductor L2 and the filter component 10 inside the module substrate 2 in plan view. In addition, as illustrated in FIG. 2, in this preferred embodiment, the shield electrode 7 is not located directly below the circuit component 3a, which includes the inductor 3b, that defines the matching network 3 in the module substrate 2 in plan view. Furthermore, the shield electrode 7 is located to significantly reduce or prevent magnetic field coupling and/or electric field coupling between the inductor L2 and the first and second filters 14 and 15. In addition, in this preferred embodiment, the inductor L2 is not superposed with the first filter 14.

In more detail, in this preferred embodiment, when a high-frequency signal flows along a signal path of the high-frequency module 1, the inductor L2 and the matching network 3 (inductor 3b) magnetically field couple and/or electrically field couple with each other and a propagation path WP that is connected to an output-side signal path of the first filter 14 is located in a region enclosed by a one dot chain line in FIGS. 1 and 2.

At this time, the degree of electromagnetic field coupling that defines the propagation path WP is adjusted such that the phase of the transmission signal that passes along the propagation path WP outside the frequency band of the transmission signal is opposite to the phase of transmission signal that passes through the first filter 14 outside the frequency band of the transmission signal and such that the amplitudes of the two high-frequency signals outside the frequency band of the transmission signal have the same or substantially the same amplitude. In the case where the transmission signal that flows toward the common electrode ANTa-side wiring electrode 4 via the first filter 14 and the transmission signal that flows toward the common electrode ANTa-side wiring electrode 4 via the propagation path WP have the same amplitude and have a phase difference of 180°, the two signals completely cancel each other out. However, there are cases where the phases of the two signals do not differ by 180° and cases where the two signals do not have exactly the same amplitude depending on variations in design, manufacture and so on. Despite this, even in cases where the phase difference between the two signals is not exactly 180°, the same effect is able to be obtained so long as the phase difference is in the vicinity of 180°. In addition, the same effect is able to be obtained even in cases where the amplitudes of the two signals are not exactly the same so long as the amplitudes are approximately the same.

Figure 4:
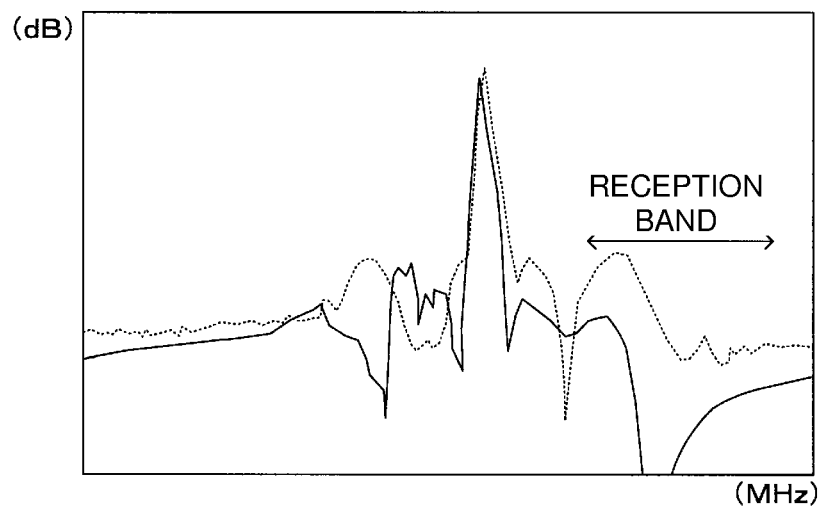
FIG. 4 illustrates isolation characteristics between a first filter and a second filter in a case where a shield electrode is not provided.
Figure 5:
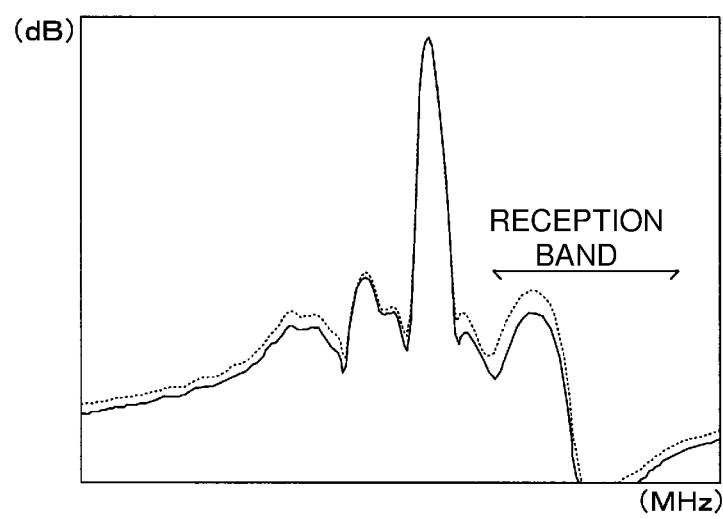
FIG. 5 illustrates isolation characteristics between a first filter and a second filter in a case where a shield electrode is provided.

Next, the isolation characteristics of the filter component 10 will be described. The isolation characteristics illustrated in FIGS. 4 and 5 indicate the magnitude of a transmission signal measured at the reception electrode Rxa (reception terminal Rxb) when a transmission signal of a prescribed frequency is input to the transmission electrode Txa (transmission terminal Txb). The horizontal axes in FIGS. 4 and 5 represent the frequency (MHz) of the high-frequency signal input to the transmission electrode Txa and the vertical axes in FIGS. 4 and 5 represent the signal level (dB) of the high-frequency signal measured at the reception electrode Rxb. The frequency range indicated by the arrows in FIGS. 4 and 5 corresponds to the frequency band of the reception signal (pass band of second filter 15) and it is necessary that signal components within this frequency range that are contained in the transmission signal that is input to the transmission electrode Txa and passes through the first filter 14 be suppressed to a prescribed magnitude or less.

Furthermore, FIG. 4 illustrates the isolation characteristics for a case where the propagation path WP is formed and a case where the propagation path WP is not formed when the shield electrode 7 is not provided, as a comparative example. Specifically, the solid line in FIG. 4 illustrates the isolation characteristics obtained when a prescribed high-frequency signal is input to the high-frequency module 1 having the propagation path WP provided by electromagnetic field coupling as described above and the broken line in the same figure illustrates the isolation characteristics obtained when the prescribed high-frequency signal is input to the high-frequency module 1 not having the propagation path WP and serving as a comparative example. As illustrated in FIG. 4, as a result of the propagation path WP being provided, the isolation characteristics in the reception band (frequency band of reception signal) are improved.

In addition, FIG. 5 illustrates the isolation characteristics for a case where the shield electrode 7 is provided and for a case where the shield electrode 7 is not provided when the propagation path WP is provided. Specifically, the solid line in FIG. 5 illustrates the isolation characteristics obtained when the prescribed high-frequency signal is input to the high-frequency module 1 provided with the shield electrode 7 and the broken line in the same figure illustrates the isolation characteristics obtained when the prescribed high-frequency signal is input to the high-frequency module 1 not provided with the shield electrode 7 as a comparative example. As illustrated in FIG. 5, the isolation characteristics in the reception band are further improved by providing the shield electrode 7 along with the propagation path WP.

As described above, in this preferred embodiment, the transmission signal of the prescribed frequency band input to the transmission terminal Txb passes through the first filter 14 and is output from the common terminal ANTb to which the matching network 3 is connected. In addition, the first ends of the inductors L1 and L2, which adjust the characteristics of the first filter 14, are connected to the ground terminals GNDb, which are connected to the parallel arm resonators P1, P2, P3 and P4 of the first filter 14, and the second ends of the inductors L1 and L2 are connected to ground (ground electrode GNDa). Furthermore, the inductor L2, which is connected to the first filter 14, and the matching network 3, which is connected to the common terminal ANTb, are located so as to magnetically field couple and/or electrically field couple with each other and thus form the propagation path WP that is connected to an output-side signal path of the first filter 14. Therefore, the transmission signal input to the transmission terminal Txb passes through the first filter 14 and along the propagation path WP, and then the two signals combine with each other in the output-side signal path of the first filter 14, which is connected to the propagation path WP.

The degree of magnetic field coupling and/or electric field coupling that defines the propagation path WP that splits from the first filter 14 is adjusted such that the phase of the transmission signal that passes along the propagation path WP outside the frequency band of the transmission signal is opposite to the phase of the transmission signal that passes through the first filter 14 outside the frequency band of the transmission signal and such that the amplitudes of the two high-frequency signals outside the frequency band are substantially the same. Therefore, a component of the transmission signal that passes through the first filter 14 that is outside the frequency band of the transmission signal and a component of the transmission signal that passes along the propagation path WP that is outside the frequency band of the transmission signal cancel each other out and are attenuated when the signals are combined. Therefore, compared with the configuration of the related art in which a correction circuit is provided by adding a circuit element such as an inductor or a capacitor, the propagation path WP that improves the filter characteristics has a simple configuration, and therefore, the attenuation characteristics outside the frequency band of the transmission signal input to the transmission terminal Txb are improved without increasing the size of the high-frequency module 1.

In addition, the shield electrode 7 is provided between the inductor L2 and the filter component 10 so as to significantly reduce or prevent magnetic field coupling and/or electric field coupling between the inductor L2 and the first and second filters 14 and 15. Consequently, unintended electromagnetic field coupling between the first and second filters 14 and 15 and the inductor L2 is significantly reduced or prevented. Therefore, unintended propagation of a high-frequency signal is significantly reduced or prevented. Therefore, the attenuation characteristics outside the frequency band of the transmission signal input to the transmission terminal Txb are improved more effectively. In addition, since the inductor L2 and the first and second filters 14 and 15 are not superposed with each other in plan view, unintended electromagnetic field coupling between the inductor L2 and the first and second filters 14 and 15 is significantly reduced or prevented.

Furthermore, since the shield electrode 7 is not located directly below the circuit component 3$a$ (inductor 3$b$), which defines the matching network 3, the propagation path WP is provided by causing the matching network 3 and the inductor L2 to electromagnetic field couple with each other with certainty.

Therefore, since the occurrence of a situation in which a high-frequency signal that is outside the frequency band of the transmission signal and has the same or substantially the same frequency band as the reception signal flows around to the second filter 15 side from an output-side signal path of the first filter 14 and is output from the reception terminal Rxb is suppressed, the high-frequency module 1 equipped with the first filter 14 and the second filter 15 having improved isolation characteristics is provided.

Second Preferred Embodiment

Next, a second preferred embodiment of the present invention will be described while referring to FIG. 6.

Figure 6:
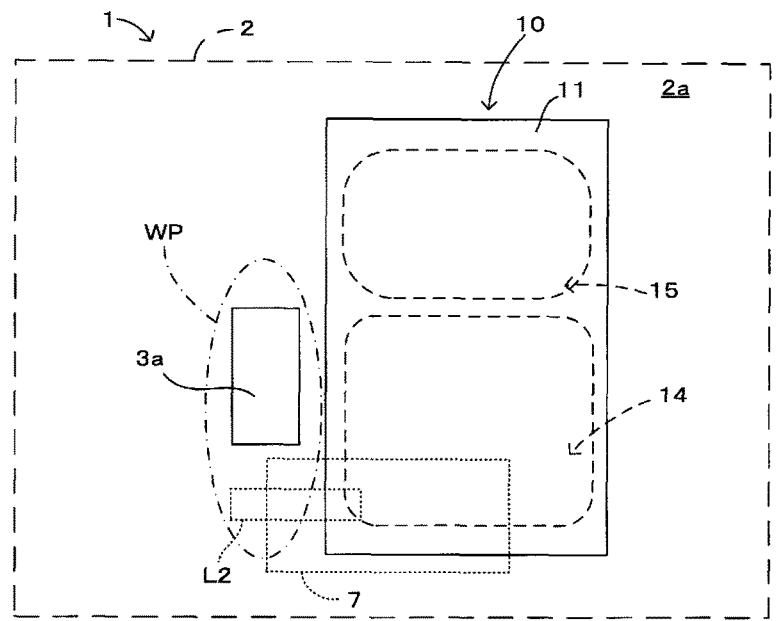
FIG. 6 is a see-through view seen from a mounting surface side of a high-frequency module according to a second preferred embodiment of the present invention.

This preferred embodiment differs from the first preferred embodiment described above in that a portion of the inductor L2 (wiring electrodes 6) close to the circuit component 3$a$ is not superposed with the shield electrode 7 in plan view, as illustrated in FIG. 6. The rest of the configuration is the same as in the first preferred embodiment described above and therefore the same symbols are used and description thereof is omitted.

By adopting this configuration, unwanted coupling between the inductor L2 and the first and second filters 14 and 15 is significantly reduced or prevented while adjusting the amount of electromagnetic field coupling between the inductor L2 and the matching network 3 by adjusting the surface area of the part where the inductor L2 does not overlap the shield electrode 7 in plan view by adjusting the surface area of the shield electrode 7 and the position at which the shield electrode 7 is located.

Third Preferred Embodiment

Next, a third preferred embodiment of the present invention will be described while referring to FIG. 7.

Figure 7:
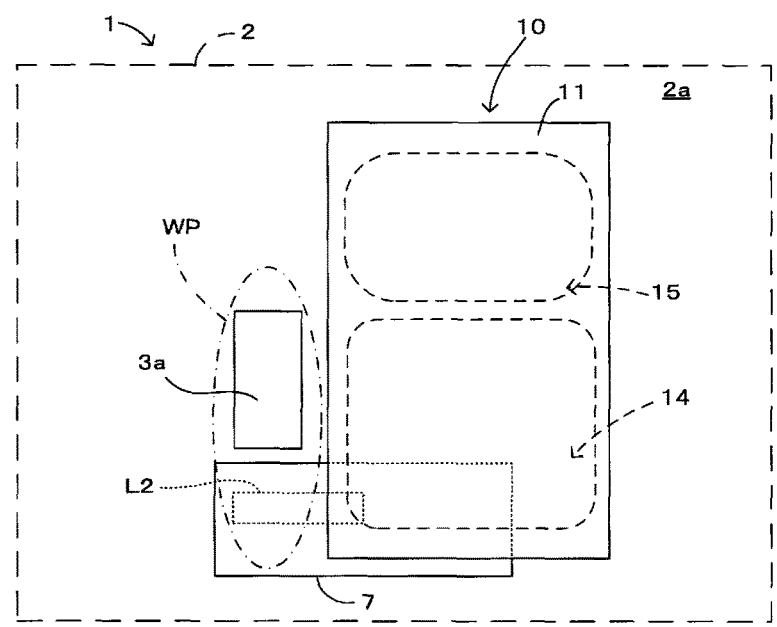
FIG. 7 is a see-through view seen from a mounting surface side of a high-frequency module according to a third preferred embodiment of the present invention.

This preferred embodiment differs from the first preferred embodiment described above in that the shield electrode 7 is located on the mounting surface 2$a$ of the module substrate 2, as illustrated in FIG. 7. The rest of the configuration is the same as in the first preferred embodiment described above and therefore the same symbols are used and description thereof is omitted. With this configuration as well, the same effect as with the first preferred embodiment described above is attained.

Fourth Preferred Embodiment

Next, a fourth preferred embodiment of the present invention will be described while referring to FIGS. 8 and 9.

Figure 8:
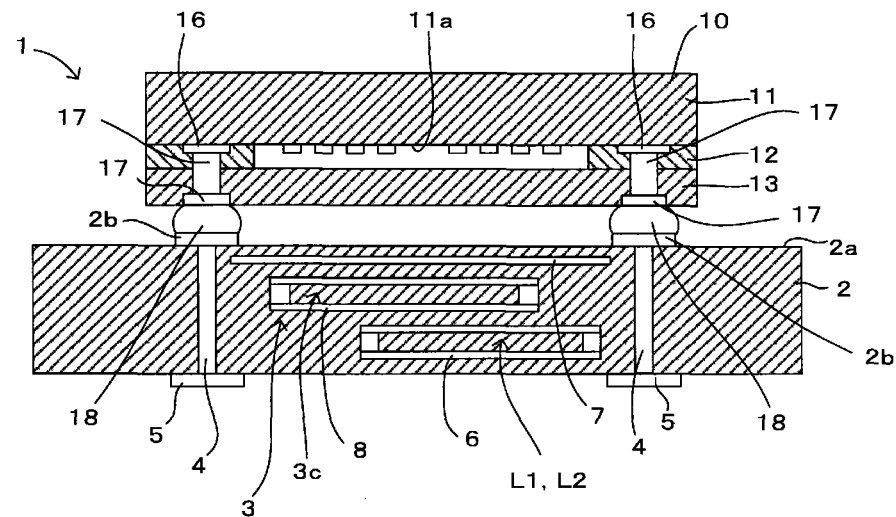
FIG. 8 is a sectional view of a high-frequency module according to a fourth preferred embodiment of the present invention.
Figure 9:
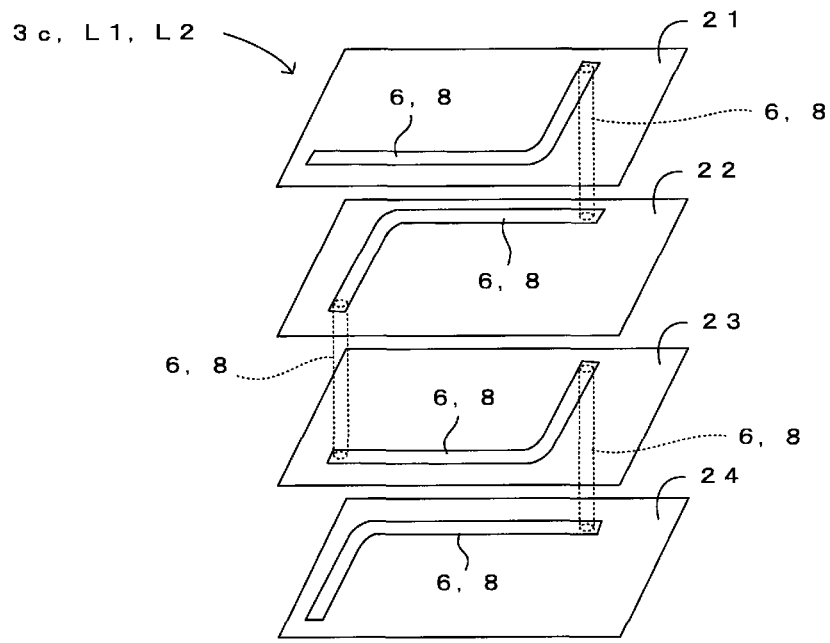
FIG. 9 is a schematic diagram illustrated the configuration of wiring electrodes that define inductors provided in a module substrate of FIG. 8.

This preferred embodiment differs from the first preferred embodiment described above in that an inductor 3$c$ (second inductor), which defines the matching network 3, preferably includes wiring electrodes 8 inside the module substrate 2, as illustrated in FIG. 8. Furthermore, a shield electrode is provided between the matching network 3 and the filter component 10 (first and second filters 14 and 15). The rest of the configuration is the same as that of the first preferred embodiment described above and therefore the same symbols are used and description thereof is omitted. The following description focuses on the differences from the first preferred embodiment described above.

As illustrated in FIG. 8, the inductor 3$c$, which defines the matching network 3, preferably includes wiring electrodes 8 provided across a plurality of dielectric layers, and the inductors L1 and L2, which adjust the characteristics of the first filter 14, are defined by the wiring electrodes 6 provided across a plurality of dielectric layers. Specifically, for example, the inductors 3$c$, L1 and L2 are structured as illustrated in FIG. 9. In other words, the inductors 3$c$, L1 and L2 include a plurality of L-shaped or substantially L-shaped in-plane conductor patterns (wiring electrodes 6 and 8) respectively provided on a plurality of dielectric layers 21 to 24 of the module substrate 2. In addition, the L-shaped or substantially L-shaped in-plane conductor patterns of the first and third dielectric layers 21 and 23 from the top preferably have the same orientation as each other and the L-shaped or substantially L-shaped in-plane conductor patterns of the second and fourth dielectric layers 22 and 24 from the top preferably have orientations obtained by rotating the in-plane conductor patterns of the first and third dielectric layers 21 and 23 through 180°.

One end of the in-plane conductor pattern of the first dielectric layer 21 on the short-piece side and another end of the in-plane conductor pattern of the second dielectric layer 22 on the long-piece side are connected to each other by a via conductor (wiring electrode 6, 8), one end of the in-plane conductor pattern of the second dielectric layer 22 on the short-piece side and another end of the in-plane conductor pattern of the third dielectric layer 23 on the long-piece side are connected to each other by a via conductor, one end of the in-plane conductor pattern of the third dielectric layer 23 on the short-piece side and another end of the in-plane conductor pattern of the fourth dielectric layer 24 on the long-piece side are connected to each other by a via conductor, and thus the spiral-shaped inductors 3c, L1 and L2 are provided.

In this way, the inductor 3c of the matching network and the inductors L1 and L2, which adjust the characteristics of the first filter 14, are provided with high inductances and formed with high precision.

Fifth Preferred Embodiment

Next, a fifth preferred embodiment of the present invention will be described while referring to FIG. 10.

Figure 10:
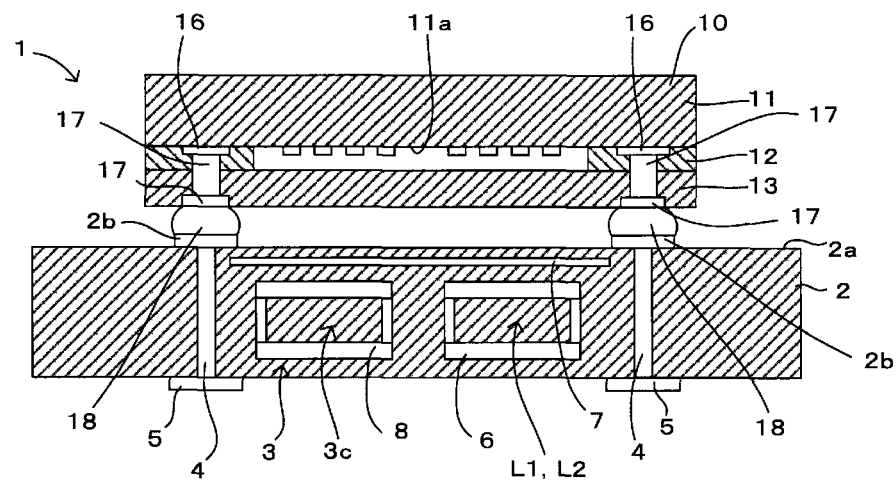
FIG. 10 is a sectional view of a high-frequency module according to a fifth preferred embodiment of the present invention.

As illustrated in FIG. 10, this preferred embodiment differs from the fourth preferred embodiment described above in that the inductor 3c (second inductor), which defines the matching network 3, and the inductors L1 and L2, which adjust the characteristics of the first filter 14, are provided side by side on the same dielectric layers. The rest of the configuration is the same as in the first preferred embodiment described above and therefore the same symbols are used and description thereof is omitted.

Sixth Preferred Embodiment

Next, a sixth preferred embodiment of the present invention will be described while referring to FIG. 11.

Figure 11:
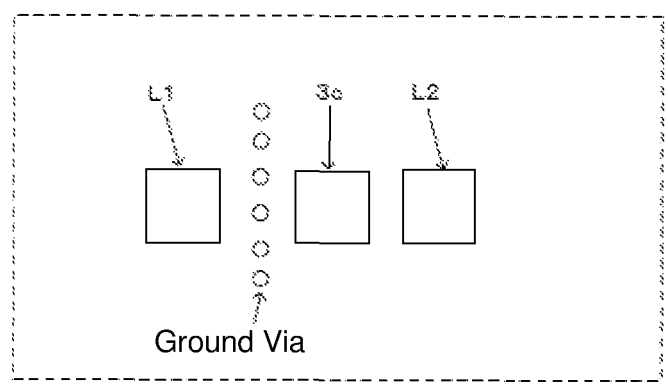
FIG. 11 illustrates a plane view of a high-frequency module according to a sixth preferred embodiment of the present invention.
Figure 12:
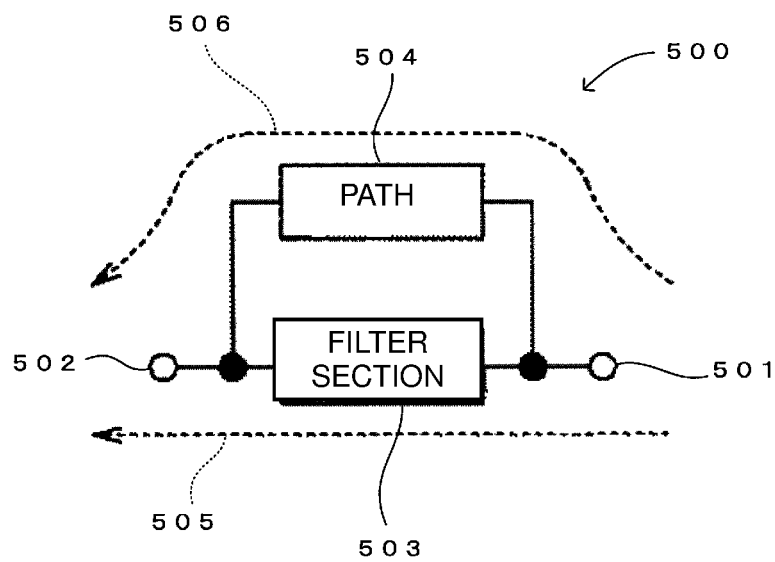
FIG. 12 illustrates a filter provided in a high-frequency module of the related art.

As illustrated in FIG. 11, this preferred embodiment differs from the first preferred embodiment described above in that the inductor 3c (second inductor), which defines the matching network 3, is defined by wiring electrodes 8 inside the module substrate 2 and in that a ground via, which is connected to the ground potential, is located between the inductor 3c (second inductor) and the inductor L1 in plan view. In addition, although not illustrated, a shield electrode is provided between the matching network 3 and the inductor L2, and the filter component 10 (first and second filters 14 and 15).

By arranging a ground via between the inductor 3c (second inductor) and the inductor L1 in plan view, unintended electromagnetic field coupling between the inductor 3c (second inductor) and the inductor L1 is significantly reduced or prevented. Therefore, unintended propagation of a high-frequency signal is significantly reduced or prevented. Therefore, attenuation characteristics outside the frequency band of the first high-frequency signal input to the first terminal are more effectively improved.

A wiring pattern, rather than a ground via, that is connected to the ground potential may instead be provided between the inductor 3c (second inductor) and the inductor L1 in plan view.

In addition, the present invention is not limited to the above-described preferred embodiments and various changes not described above can be made so long as they do not deviate from the gist of the present invention and the configurations of the above-described preferred embodiments may be combined in any manner with each other. For example, in the preferred embodiments described above, the description focused on an example in which the inductor L2, which adjusts the characteristics of the first filter 14, and the matching network 3 are connected to each other in a high-frequency manner, but a configuration may instead be adopted in which the inductor L1 and the matching network 3 are connected to each other in a high-frequency manner and the propagation path WP is located therebetween. In this case, the shield electrode 7 should be arranged so as to significantly reduce or prevent electromagnetic field coupling between the inductor L1 and the first and second filters 14 and 15.

Furthermore, the plurality of inductors L1 and L2 may be connected to the matching network 3 in a high-frequency manner. In addition, the degree of electromagnetic field coupling that defines the propagation path WP should be adjusted such that at least the phase characteristics of the transmission signal (first high-frequency signal) that passes along the propagation path WP outside the frequency band of the transmission signal are different from the phase characteristics of the transmission signal (first high-frequency signal) that passes through the first filter 14 outside the frequency band of the transmission signal.

In addition, in order to reduce or prevent electromagnetic field coupling between the inductor L2 and the first and second filters 14 and 15, the wiring electrodes 6 that define the inductor L2 preferably extend from a portion where the wiring electrodes 6 are superposed in plan view with the electrodes 17, which define the ground terminals GNDb of the filter component 10 to which the wiring electrodes 6 are connected, into the region where the circuit component 3a is arranged, as illustrated in FIGS. 2, 6 and 7. With this configuration, the portion where the inductor L2 and the filter component 10 (first and second filters 14 and 15) are superposed in plan view is significantly reduced or minimized and therefore, electromagnetic field coupling between the inductor L2 and the first and second filters 14 and 15 is more effectively reduced or prevented.

Furthermore, the shield electrode 7 may be superposed with the entire surface of the filter component 10 in plan view. With this configuration, electromagnetic field coupling between the inductor L2 and the first and second filters 14 and 15 is more effectively reduced or prevented. In addition, the inductor L2 and the circuit component 3a may be superposed with each other in plan view. With this configuration, the inductor L2 and the circuit component 3a high-frequency couple with each other more strongly.

Furthermore, the configuration of a ladder filter that is included in the first filter 14 is not limited to the example described above and the first filter 14 may be structured or formed in any manner so long as the configuration of the ladder filter is a configuration that includes a shunt-connected resonator in order to adjust the filter characteristics. In addition, the configuration of the second filter 15 may include a resonator that utilizes elastic waves and the second filter 15 may be defined by a typical LC filter. Furthermore, not limited to SAW filters, the first filter 14 and the second filter 15 may be defined by FBAR or SMR BAW filters that utilize bulk elastic waves as filters that utilize elastic waves.

In addition, the configuration of the filter component 10 is not limited to the WLP structure described above, and may be defined using a so-called CSP structure that includes a package substrate, or may be a configuration in which the cover layer 13 is not provided and a bare-chip-structure filter component 10 is directly mounted on the mounting surface 2a of the module substrate 2.

In addition, the wiring electrodes 6 that define the inductors L1 and L2 may have any shape, and the inductors L1 and L2 may be defined by wiring electrodes 6 with a variety of shapes such as a meandering shape, a spiral shape, a linear shape, a helical shape that is defined across multiple layers, a toroidal shape, and so on.

In addition, in the above-described preferred embodiments, a high-frequency module 1 in which a single filter component 10 is mounted on the module substrate 2 is described as an example, but a high-frequency module may be provided by mounting two or more filter components 10 on the module substrate 2, and in such a case a switch IC may be mounted on the module substrate 2 and the filter component 10 to be used may be selected and switched to by the switch IC from among the plurality of filter components 10 mounted on the module substrate 2.

Furthermore, although the first filter 14 and the second filter 15 are arranged in the same space in the above-described preferred embodiments, two spaces that are surrounded by the insulating layer 12 may be provided between the filter substrate 11 and the cover layer 13, and the first filter 14 and the second filter 15 may be respectively located in these spaces. When such a configuration is adopted, the first filter 14 and the second filter 15 are arranged so as to be structurally isolated from each other, and as a result, for example, the effect of heat generated due to power being applied to the first filter 14 on the characteristics of the second filter 15 is significantly reduced or prevented and the isolation characteristics between the first filter 14 and the second filter 15 are further improved. Alternatively, a first filter 14 and a second filter 15 that are individual chips may be provided.

Preferred embodiments of the present invention are able to be broadly applied to high-frequency modules that have a function of separating a transmission signal and a reception signal from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a filter component including:
      a first terminal to which a first high-frequency signal is input;
      a first filter through which the first high-frequency signal input to the first terminal passes;
      a second terminal that outputs the first high-frequency signal that has passed through the first filter; and
      a third terminal that is connected to the first filter;
   a matching network that is connected to the second terminal;
   a module substrate on which the filter component is mounted;
   an inductor that adjusts characteristics of the first filter and is provided inside the module substrate, the inductor including a first end connected to the third terminal and a second end thereof connected to ground; and
   a shield electrode between the inductor and the filter component; wherein
   the inductor and the matching network define a propagation path by electromagnetic field coupling with each other;
   the matching network and the filter component do not electromagnetic field couple with each other; and
   the shield electrode is located to suppress electromagnetic field coupling between the inductor and the filter component.

2. The high-frequency module according to claim 1, wherein
   the matching network and the first filter do not electromagnetic field couple with each other; and
   the shield electrode is located to suppress electromagnetic field coupling between the inductor and the first filter.

3. The high-frequency module according to claim 2, wherein a distance between the matching network and the first filter is larger than a distance between the matching network and the inductor.

4. The high-frequency module according to claim 1, wherein
   the matching network includes a chip circuit component that is mounted on a mounting electrode provided on a mounting surface of the module substrate; and
   the circuit component and the shield electrode are not superposed with each other in plan view.

5. The high-frequency module according to claim 1, wherein
   the module substrate includes a plurality of dielectric layers;
   the matching network is provided inside the module substrate; and
   the shield electrode is provided between the matching network and the first filter.

6. The high-frequency module according to claim 5, wherein the matching network is provided on a same dielectric layer as the inductor among the plurality of dielectric layers.

7. The high-frequency module according to claim 5, wherein the matching network is provided on a different dielectric layer from the inductor among the plurality of dielectric layers, and the matching network and the inductor are partially superposed with each other in plan view.

8. The high-frequency module according to claim 6, wherein
   the matching network includes wiring electrodes provided across the plurality of dielectric layers; and
   the inductor includes wiring electrodes provided across the plurality of dielectric layers.

9. The high-frequency module according to claim 1, wherein the inductor is not superposed with the first filter in plan view.

10. The high-frequency module according to claim 1, wherein a portion of the inductor is not superposed with the shield electrode.

11. The high-frequency module according to claim 1, wherein the inductor and the matching network electrically field couple with each other.

12. The high-frequency module according to claim 1, wherein the shield electrode is mounted on a mounting surface of the module substrate.

13. The high-frequency module according to claim 1, wherein the matching network includes wiring electrodes inside the module substrate.

14. The high-frequency module according to claim 13, wherein another shield electrode is located between the matching network and the filter component.

15. The high-frequency module according to claim 1, wherein the matching network includes another inductor located on a same dielectric layer of the plurality of dielectric layers as the inductor.

16. The high-frequency module according to claim 1, wherein the matching network includes another inductor defined by wiring electrodes inside of the module substrate.

17. The high-frequency module according to claim 16, wherein a ground via is located between the another inductor and the inductor.

18. The high-frequency module according to claim 16, wherein a wiring pattern is located between the another inductor and the inductor.

19. A mobile communication terminal comprising the high-frequency module according to claim 1.

20. The mobile communication terminal according to claim 19, wherein the mobile communication terminal is one of a cellular phone and a mobile information terminal.

* * * * *